United States Patent
Bootello et al.

(10) Patent No.: US 9,140,241 B2
(45) Date of Patent: Sep. 22, 2015

(54) MANAGEABLE HYBRID PLANT USING PHOTOVOLTAIC AND SOLAR THERMAL TECHNOLOGY AND ASSOCIATED OPERATING METHOD

(75) Inventors: Juan Pablo Nuñez Bootello, Sevilla (ES); Salvador Valenzuela Rubia, Sevilla (ES); Lucia Serrano Gallar, Sevilla (ES); Lucia Fernandez Calderon, Sevilla (ES)

(73) Assignee: Abengoa Solar New Technologies, S.A., Seville (ES)

( * ) Notice: Subject to any disclaimer, the term of this patent is extended or adjusted under 35 U.S.C. 154(b) by 278 days.

(21) Appl. No.: 13/825,311

(22) PCT Filed: Sep. 20, 2011

(86) PCT No.: PCT/ES2011/000283
§ 371 (c)(1),
(2), (4) Date: Jun. 5, 2013

(87) PCT Pub. No.: WO2012/038566
PCT Pub. Date: Mar. 29, 2012

(65) Prior Publication Data
US 2013/0298964 A1 Nov. 14, 2013

(30) Foreign Application Priority Data
Sep. 21, 2010 (ES) .................................. 201001207

(51) Int. Cl.
*F03G 6/00* (2006.01)
*F01K 13/00* (2006.01)
(Continued)

(52) U.S. Cl.
CPC ... *F03G 6/06* (2013.01); *F24J 2/38* (2013.01); *H01L 31/054* (2014.12);
(Continued)

(58) Field of Classification Search
CPC ......... F03G 6/06; H02S 40/44; H01L 31/054; F24J 2/38; F24J 2/10; F24J 2002/1076; F24J 2002/0092; Y02E 10/46; Y02E 10/60; Y02B 10/12; Y02B 10/20; Y02B 10/70
USPC .................. 60/641.8–641.15, 659, 676, 698; 290/1 R; 136/244, 248
See application file for complete search history.

(56) References Cited

U.S. PATENT DOCUMENTS 4,551,980 A * 11/1985 Bronicki ......................... 60/698
5,932,029 A 8/1999 Stone et al.
(Continued)

FOREIGN PATENT DOCUMENTS

DE 102008051334 B3 2/2010
DE 102008039320 3/2010
(Continued)

OTHER PUBLICATIONS

"New special regime generators with combustion or solar thermal process" in the paragraph "Assessment of solar thermal power plants manageability" www.ree.es/transporte/procedimientos_acceso_conexion.asp.
(Continued)

*Primary Examiner* — Hoang Nguyen
(74) *Attorney, Agent, or Firm* — Kilpatrick Townsend & Stockton LLP

(57) ABSTRACT

Manageable hybrid plant using photovoltaic and solar thermal technology and associated operating method, wherein said hybrid plant comprises three levels of generation:
Level 1 (1) of photovoltaic generation (42) covering the self consumption of the plant;
Level 2 (2) of generation of the solar thermal plant (44) and another part of photovoltaic generation (45) that covers the consumption of the auxiliary services of the solar thermal plant (43);
Level 3 (3) of generation of another area of photovoltaic production (46) that improves the total production curve,
the total power generated by the hybrid plant and discharged into the network (47), being the result of the sum of generation of the three levels.
The photovoltaic modules of the invention are located in: in the north or south side of the tower not occupied by the cavity; the area surrounding the solar receivers of the tower; on covers or roofs of the plant at the rear of the heliostats; on land annexed to the tower plant.

31 Claims, 4 Drawing Sheets

(51) Int. Cl.
*F03G 6/06* (2006.01)
*F24J 2/38* (2014.01)
*H01L 31/054* (2014.01)
*H02S 40/44* (2014.01)
*F24J 2/10* (2006.01)
*F24J 2/00* (2014.01)

(52) U.S. Cl.
CPC .................................. *H02S 40/44* (2014.12); *F24J 2/10* (2013.01); *F24J 2002/0092* (2013.01); *F24J 2002/1076* (2013.01); *Y02B 10/12* (2013.01); *Y02B 10/20* (2013.01); *Y02B 10/70* (2013.01); *Y02E 10/46* (2013.01); *Y02E 10/60* (2013.01)

(56) References Cited

U.S. PATENT DOCUMENTS

| | | | | |
|---|---|---|---|---|
| 7,654,073 | B2* | 2/2010 | Primlani | 60/39.183 |
| 7,845,172 | B2* | 12/2010 | Goldman | 60/641.8 |
| 7,964,787 | B2* | 6/2011 | Jaisinghani | 136/248 |
| 2005/0058452 | A1 | 3/2005 | Kramer et al. | 398/71 |
| 2008/0245402 | A1* | 10/2008 | Romeo | 136/248 |
| 2009/0223511 | A1* | 9/2009 | Cox | 126/714 |
| 2009/0229264 | A1 | 9/2009 | Gilon et al. | |
| 2009/0260619 | A1 | 10/2009 | Bailey et al. | |
| 2011/0000515 | A1* | 1/2011 | Patwardhan et al. | 136/206 |
| 2013/0276447 | A1* | 10/2013 | Chaix | 60/641.15 |

FOREIGN PATENT DOCUMENTS

| | | |
|---|---|---|
| EP | 0927857 A2 | 7/1999 |
| WO | 9512757 | 5/1995 |
| WO | 2009/089571 | 7/2009 |
| WO | 2009/152574 | 12/2009 |

OTHER PUBLICATIONS

Daniel Feuermann and Jeffrey M. Gordon. 1999. "Solar fiber optic mini dishes a new approach to the efficient collection of sunlight," Solar Energy. vol. 65, No. 3., p. 159-170.

Segal A; Epstein M; Yogev A. "Hybrid concentrated photovoltaic and thermal power conversion at different spectral bands." Solar Energy. Jan. 1, 2004. 76(5). p. 591-601.

IPRP for related PCT/ES2011/000283 dated Dec. 3, 2012 and its English translation.

ISR for related PCT/ES2011/000283 dated Feb. 7, 2012 and its English translation.

Supplementary European Search Report and Search Opinoin completed Feb. 11, 2015 for European Patent Application No. EP11826441 filed Sep. 20, 2011, all pages.

* cited by examiner

MANAGEABLE HYBRID PLANT USING PHOTOVOLTAIC AND SOLAR THERMAL TECHNOLOGY AND ASSOCIATED OPERATING METHOD

CROSS-REFERENCE TO RELATED APPLICATIONS

This application is the national stage of International Patent Application no. PCT/ES2011/000283, filed on Sep. 20, 2011, which claims priority from Spanish patent application no. P201001207, filed on Sep. 21, 2010, the disclosures of which are incorporated herein in their entireties.

TECHNICAL FIELD OF THE INVENTION

The invention falls within the field of electricity generation from solar radiation, more specifically, is encompassed within the field of hybrid plants, since it combines solar thermal technology with photovoltaic technology.

BACKGROUND OF THE INVENTION

Studying Spanish legislation regarding renewable energy, the Royal Decree 661/2007 of May 25, for regulating the activity of production of electrical energy in special regime, states that there are two types of facilities for electricity production from solar energy:

Subgroup b.1.1. Facilities that only use solar radiation as primary energy by means of photovoltaic technology.

Subgroup b.1.2. Facilities using only thermal processes for the transformation of solar energy as primary energy into electricity. These facilities may be using equipment that uses a fuel for the maintenance of the temperature of the heat transfer fluid to compensate for the lack of solar radiation that may affect the planned delivery of energy ( . . . ).

If we attend to the needs of the Red Eléctrica Española (REE), independent company dedicated exclusively to the transport and operation of the Spanish electrical network, to carry out a secure integration of renewable plants in the electrical system, it is required that they comply with certain requirements such as: uninterrupted supply, supply quality (minimizing oscillations in the supply) and manageability.

Annex 11 RD 661/2007 reads " . . . for the purpose of this Royal Decree, unmanageable generation is defined as one where its primary source is not controllable and cannot be stored and the associated production plants of which have no possibility of carrying out a production control following instructions from the operator of the system without incurring in a spill of primary energy, or the strength of future production is not enough to be considered as a program.

In principle, special regime generators that according to the classification established in this Royal Decree are included in the groups b.1, b.2 and b.3, as well as flowing hydraulic generators integrated in groups b.4 and b.5 are considered unmanageable, unless specific manageable assessment of a generating plant to be made by the system operator, with the consequent application of the requirements or conditions associated with said condition."

That is, according to the RD in principle, both photovoltaic (b.1.1) and solar thermal (b.1.2) energy are regarded as unmanageable. However, REE has access and connection procedures published on its website: http://www.ree.es/transporte/procedimientos_acceso_conexion.asp.

Specifically, the data form "New special regime generators with combustion or solar thermal process" in the paragraph "Assessment of solar thermal power plants manageability" defines the criteria to be met by solar thermal power plants to be considered manageable and that are generally:

1. Being ascribed to a Generation Control Center enabled by RED ELÉCTRICA, meeting the requirements of observability and controllability by the System Operator established by the regulations for facilities over 10 MW.
2. Reliability in horizons programming of:
   24 hours (strength>=90%, including probability of failure of equipment)
   6 hours (strength>=95%, including probability of failure of equipment)
   Availability of mechanisms to correct deviations on program:
   Indication of generation means and alternative fuel
   Implementation capacity
3. Storing primary energy corresponding to the operation of the plant for 4 hours at full power. The facility should be able to provide the production stored for any of the 24 hours following the time at which the reduction ends, with a minimum efficiency of 60% of the storage/retrieval cycle. Alternatively, that the plant is able to increase its program in at least 30% of the maximum power, under certain conditions.
4. Meeting a set of requirements in relation to the behavior with voltage disturbances.
5. In regard to other types of disturbances, and particularly to changes in the system frequency, generators and their protective equipment shall meet the requirements established on the application operating methods.

If the requirements imposed by REE are met, the solar thermal power plants would be considered manageable. Moreover, being an unmanageable source of energy results in a number of disadvantages such as, among others:

Limitation in generating capacity: RD 661/2007 Annex XI " . . . For the unmanageable generation, the generating capacity of a facility or group of facilities that share the connection point to the network will not exceed 1/20 of the short-circuit power of the network at said point . . . "

No participation in the system adjustment services (Article 33, RD 661/2007): "All the special regime facilities will be able to participate except for those unmanageable, prior authorization by resolution of the Directorate General for Energy and Mines Policy and enabling the system operator ( . . . )"

Guarantee of power (second additional disposition RD 661/2007): "Those facilities, if any, covered by the special regime which have opted to sell their energy freely in the market will have the right to collect a fee for power guarantee, according to Article 24.1.b, except for facilities that use an unmanageable primary energy".

However, there are advantages in producing electrical energy from renewable sources, such as the priority in the evacuation according to Annex XI, RD 661/2007: "( . . . ) special regime generators have priority for the evacuation of the energy produced compared to the ordinary regime generators, with particular preference for the generation of unmanageable special regime from renewable sources.

Likewise, with the aim of contributing to a secure and maximum integration of the generation of unmanageable special regime the system operator will consider as preferential those generators which technology suitability further contribute to guarantee the conditions of security and quality of supply for the power system."

The problems of quality, continuity and supply management that are indicated for the case of Spain occur regardless of the territory wherein the plants are installed. In other countries like the United States the own electric companies are the ones that must ensure that some of the electricity sold comes from renewable sources, and is therefore of their interest that it is as manageable as possible.

The immediate consequence of the problems of manageability of photovoltaics is that governments limit the size of photovoltaic plants for generating electricity to sizes smaller than those of the solar thermal power plants (50 MW maximum for power per photovoltaic plant in the case of Spain, 5 MW in India, interest in photovoltaic project proposals between 15 and 50 MW in Arizona, up to 15 MW in the state of Nevada, 30 MW in Israel, etc.).

Gathering the characteristics of each of the two types of generation from solar radiation, we have:

I) Photovoltaic generation:
  Unmanageable, does not allow thermal storage or hybridization with gas
  Have priority on the evacuation of energy produced
  Low reliability to meet demand peaks
  Coupling without attending system requirements
  Variable behavior, with significant gradients
  Reduced production at demand peak periods during summer and winter. During the summer due to lower efficiency in the inverter and the cell due to high temperatures and during the winter because there are lower values of solar radiation.
  Difficulty of prediction: strongly increasing error rates with the forecasted horizon
  It has limitations in assignments against manageable energy
  It has limitation in generation capacity that shall not exceed one twentieth (5%) of the short circuit power of the network at the connection point to the network
  More oriented to cover self consumption and the excess is fed into the network II) Solar thermal generation:
  Manageable: meeting what is defined according to data form "New special regime generators with combustion or thermal solar process" in the subsection "Assessment of manageability of solar thermal plants"
  Immunity against disturbances
  Inertia and regulation
  Programmable (storage+hybridization with gas up to a maximum of 12% of the total of electricity production)
  Energy with a support capacity in summer peaks
  Possibility of participating in adjustment services Taking into account the objectives established by governments of individual countries for the integration and the promotion of renewable energy, a series of efforts are demanded from administrations as well as the operators of the electrical system, and the promoters of solar plants. The latter are invited to improve the design of technologies, maximizing the contribution to management (i.e., achieving quick acting plants, energy storage . . . ).

As for the type of solar thermal technology used for said combination, all known systems (parabolic or disc collector, parabolic cylinder, Fresnel, tower . . . ) are valid and even the latest technology developed wherein the solar collectors concentrate the light directing it to optical fibers or other light guides that lead it to a receiver located on the ground. An example of this technology of concentration based on optical fiber appears in the reference: "Solar fiber optic mini dishes a new approach to the efficient collection of sunlight", Daniel Feuermann and Jeffrey M. Gordon. Solar Energy Vol. 65, No. 3, pp. 159-170, 1999 Elsevier Science Ltd.

In the state of the art there are several developments that have combined two technologies, solar thermal and photovoltaic, but not on a large scale and to supply the network as is the case in question in this invention. For example, the document WO2009/089571 describes a parabolic reflector wherein a pipe with the heat transfer fluid and/or a photovoltaic cell is installed.

In the state of the art there are also a number of patents applied for by the company Solar Systems Pty Ltd, such as document WO 2009/152574 on which the HCPV system is protected, that consist of installing a tower similar to solar thermal towers, a receiver based on photovoltaic cells, all the energy produced being of photovoltaic type, not combined with solar thermal.

Thus, the object of this invention is focused on obtaining a solar hybrid plant that, thanks to the combination of solar thermal and photovoltaic technology, achieves a minimizing in electricity production cost, ensures the continuity and quality of supply and can be classified as a manageable generation plant, without every country regulation limiting the maximum amount of solar photovoltaic energy contribution.

DESCRIPTION OF THE INVENTION

The invention consists of a manageable hybrid plant of solar thermal and photovoltaic technology.

This system, unlike the known state of the art, comprises a concentration solar thermal plant combined with a photovoltaic area.

In the case of solar thermal technology and more specifically, the systems of tower central receiver, solar radiation is concentrated using heliostats, in a receiver located on top of a tower (specifically in the focus of the optical system), where said solar radiation is transformed into thermal energy through heat absorption by the heat transfer fluid flowing through the receiver. That heat transfer fluid may be, for example saturated, superheated steam, salts or any other heat transfer fluid. In the case of a fluid other than steam, a heat exchanger is used to produce said steam, which is then sent to a turbine to produce electricity.

Recently, new concepts of compact solar thermal plants are being developed in which solar collectors concentrate the light directing it to optical fibers or other light guides that lead it to a receiver located on the ground.

In photovoltaic technology, solar radiation is captured in photovoltaic panels that generate electricity in the form of direct current. In those facilities connected to the network, the direct current is transformed into alternating current by an inverter and discharged into the electrical network.

In the invention claimed herein, the use of both technologies, photovoltaic and solar thermal with or without light guides (fiber optics) is combined, the location of the photovoltaic panels being a key to the increase of efficiency and the decrease of plant costs.

Photovoltaic technology is combined with solar thermal technology, sharing the land for the location of the thermoelectric and photovoltaic modules concentration system. In the specific case of a tower plant, the solar tower itself, as well as the heliostats can even be used for the location of photovoltaic modules. In this last form the transport costs of photovoltaic energy produced are minimized and having to provide more area for its installation is avoided.

Possible locations of photovoltaic panels of the invention for the case of solar thermoelectric tower plants are divided into three areas: collecting area at solar thermal process zone, photovoltaic collecting area integrated in the solar thermoelectric concentrators and area of photovoltaic production.

1. The collecting area in the solar thermal process zone may include photovoltaic panels in:

In the case of a tower plant facing north (heliostats placed north of the tower and cavity facing north), the photovoltaic panels would be located on the south side of the tower itself, making use of its large surface and good orientation (panels facing the sun), installing fixed panels of Thin film technology, polycrystalline or monocrystalline Si, or high efficiency cells formed by III-V periodic elements or combinations of these, etc. They would be installed in the opposite direction in the case of solar tower plants facing south (southern latitudes). The east and west sides of the tower, could also be used if these were not occupied by cavities, as well as the cover of the tower itself.

The photovoltaic panels can also be placed in the area surrounding the solar receivers of the tower, what helps to take advantage of the losses due to overflow, that is, all that solar radiation reflected by the heliostats but that escapes from the collecting area of the receivers. Panels are installed with high efficiency cells that can work with concentrated radiation. Additionally and in order to avoid heating of panels by high temperatures that would reduce their efficiency, these may be accompanied by a water cooling system. The thermal energy produced by this cooling system can be introduced into a heat exchanger (economizer) which preheats the water going directly to the receiver of the solar thermal tower. In addition, with a correct design of this photovoltaic system, solar radiation could be used by the heliostat field blur in the case that the DNI (Direct Normal Irradiance) exceeds the nominal of the design since the blurring point of heliostats is located around the receiver; which area has been proposed to be covered with photovoltaic technology.

2. Photovoltaic collecting area integrated in the thermoelectric solar concentrators can place photovoltaic panels in:

the back of the heliostats, placing photovoltaic modules that recover losses by blocking (losses caused by lightning reaching the back of the neighboring heliostats, instead of reaching the receiver), where the electricity generated here is used first, for self consumption of the solar tracker of the heliostat itself and secondly for self consumption of the power portion of the plant.

In the clear opening of the heliostats. The heliostats would thus have part of their opening occupied by mirrors and another part occupied by photovoltaic panels. The photovoltaic panels can be placed in the center of the heliostat, leaving the periphery to the mirrors or the other way around, the central part with mirrors and the periphery with the photovoltaic modules. They could also be placed alternately or randomly, occupying between both of them the total clear opening of the heliostat.

3. Area of photovoltaic production: a set of photovoltaic modules with or without tracking, with or without concentration, can be placed attached to the tower plant; they could be located at the corner of a property with square boundaries (since the heliostats fields have traditionally a circular shape) or part of the land could be left at the back of the tower or in front of the tower for the photovoltaic panels, or in another location, but so that the area of photovoltaic production has a size that generates enough electricity for both supplying self consumption of the plant and for discharge into network. In the case of fixed panel systems there is the additional advantage that it is possible to inject to the network during the day when there is wind alarm (heliostats in safety position and tower stopped).

To complete the objective of the manageability of the solar thermal plant, the solar plant is hybridized with a natural gas boiler, such as permitted by the RD 661/2007, "in these facilities may be used equipment that use fuel to maintain the temperature of the heat transmission fluid to compensate for the lack of solar radiation that may affect the planned delivery of energy", so that it meets the requirement of being able to reach full power in less than ½ hour from the request of the system operator.

The solar thermal plant is completed with a storage system that comprises a series of tanks for thermal storage in the form of steam or molten salt. In the case of molten salt storage, a heat exchanger to transfer heat from the salt to the steam that will be subsequently turbinated is also added. This storage would allow complying with the requirement of having a storage capacity of primary energy of at least 4 hours of use.

The management of power carried out in the plant is a consequence of a criterion of self-reliance and maximum utilization of the photovoltaic resource to supply at all times for self consumption of the plant. The distribution of the photovoltaic field in the plant requires a generation and consumption of the photovoltaic resource by zones or levels. All levels of generation and consumption are interconnected with each other to take advantage of any excess or lack of energy and can thus be supported or support at any time.

The mode of operation of the plant would be as follows:

1. When a sunny day starts, in the morning the DNI or solar irradiance is low; the solar thermal plant with the help of natural gas auxiliary boiler begins to generate steam.
2. Once the solar field exceeds the power of the auxiliary boiler, this is decoupled from the system and the solar thermal plant, while generating electricity, starts feeding the storage system.
3. In the case of occurrence of transient states in which the DNI or solar irradiance decreases or even disappears temporarily, for example by passing clouds, the thermal inertia of the system itself, combined with the possibility of energy recovery from the storage system and the possibility of reuse of the gas auxiliary boiler, achieve producing an electrical signal with high continuity.
4. As long as there is solar radiation, the photovoltaic cells will generate an electrical signal. This signal, however, will fluctuate with no inertia following the fluctuations of DNI. Part of the photovoltaic generation energy will be used directly to cover self consumption of the plant. In the case of the preferred embodiment given above, the self consumption energy would be, first, the one generated in the photovoltaic modules that are installed in the heliostats. It would also be the case during the early morning; the solar thermal plant turbine takes some time to reach its rated conditions while the photovoltaic plant produces electricity from the first moment that there is sun. The rest of the electricity generated by the photovoltaic field and not used for self consumption of the plant will produce an electrical signal that will be combined with the electrical signal from the solar thermal plant and that is injected into the network.

Thus, the photovoltaic field contributes to the production of kWe early in the morning when the solar thermal field is not yet able to start producing. When there are transients, the thermal solar field with its inertia and together with the auxiliary boiler and the storage system—depending on the duration of the cited transient—is the one that gives continuity to the electric production. And the same would happen once the sun has set at nightfall.

During the design phase of the plant, the right photovoltaic field—solar thermal field ratio will produce a manageable final signal ensuring quality and continuity of supply, according to regulations and that minimizes the cost of electricity production taking advantage of the synergies of both technologies.

Regarding how to manage the electric energy produced at the facility it is differentiated into three main levels. The first level, Level 1, comprises the photovoltaic collecting area integrated in the thermo-electric solar concentrators, which main mission is to support the feeding systems of the tracking engines of the thermoelectric solar concentrating system. In times of high demand by the tracking engines, this system will find reinforcement of the interconnection with the higher voltage level or Level 2. On the contrary, in the case of excess of production, this energy will be evacuated by the aforementioned line of level 2.

Level 2 comprises the collecting zone in the thermal process zone, for example the panels with high efficiency photovoltaic cells located on different sides of the tower, around the cavity or on covers of various facilities of the plant solar thermal plant. Its role will be to feed the auxiliary services of the plant (pumps, control systems, etc.) and when there is excess production it will support as mentioned level 1 or it will evacuate to level 3.

The third level, level 3, comprises the area of photovoltaic production (photovoltaic panels located in areas of the plot sharing field with the concentrating elements of the thermoelectric solar system) and receiver of the solar thermoelectric system. Through it the excess production from lower levels (level 1 and 2) will be discharged and it will also be responsible for supporting an excess of power demand of said levels if necessary.

The power management model set forth above has as mission, in addition to improving the daily production curve, to carry out a management of self-sufficiency of the energy required for the solar thermal process due to photovoltaic generation.

Thus, from the standpoint of the photovoltaic plant, hybridizing with solar thermal tower produces benefits such as:

Converting generated electricity into manageable and solving the problems of quality and continuity of supply.

Gaining market share in the sector of large electricity generation plants as currently due to its unmanageable nature and problems of quality and continuity of supply, the sizes of the photovoltaic plants are limited by the regulation of different countries to sizes significantly lower than those of thermal solar plants.

From the standpoint of thermoelectric solar plants, specifically for the preferred case of solar thermal tower, hybridizing with photovoltaic allows:

Making use of the side of the tower not occupied with cavity (in this case using cells with high efficiency), or part of the ground with fixed photovoltaic. In the latter case, there is the added advantage of allowing injecting to the network during the day when there is wind alarm (heliostats in safety position and tower stopped)).

Taking advantage of overflows in the receiver of the tower.

Making use of the back of the heliostats.

No need for installing preheaters in the tower to increase efficiency since the cooling of the photovoltaic preheats the water.

Covering self consumption of the recirculation pumps, water treatment plants, self consumption of the power block, lighting and other services during the day.

Covering self consumption of heliostats (due to consumption of the engines that allow the tracking of the heliostats)

Covering the total self consumption of the plant

Reducing costs of electricity production

In conclusion, with this hybrid plant that combines solar thermal and photovoltaic technologies, obtaining a new facility concept for the production of electricity from solar energy is achieved, that could be conceived as a third subset of those contained in the RD 661/2007 combination of the above and that could be defined as "Facilities that use solar radiation as primary energy, combining photovoltaic technology and thermal processes, for transforming solar energy into electricity. In these facilities may be used equipment that use fuel to maintain the temperature of the heat transfer fluid to compensate for the lack of solar radiation that may affect the planned delivery of energy." This would result in the integration of photovoltaic energy in electricity generation, eliminating the limit established on its production capacity, and increasing at the same time the efficiency of the solar thermal plant.

DESCRIPTION OF THE DRAWINGS

To complete the description being made and in order to help to a better understanding of the invention, it is accompanied by a set of drawings wherein by way of illustration and not limitation, the following has been represented.

The references of the figures represent.

Figure 1:
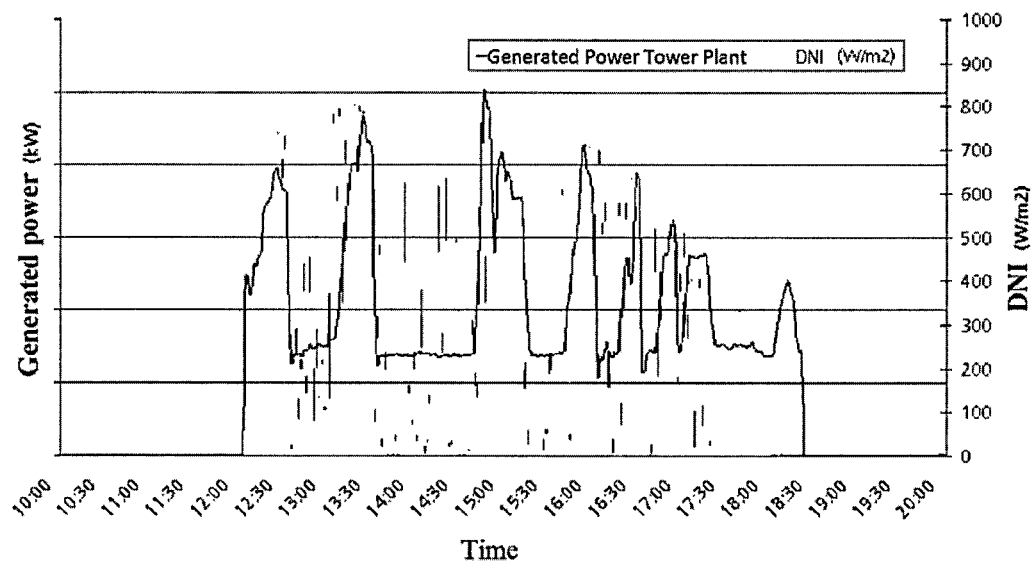
FIG. 1: Power generated by a tower solar thermal plant versus DNI

(1) Level 1 of generation
(2) Level 2 of generation
(3) Level 3 of generation
(11) Connection 1 of Level 1
(12) Connection 2 of Level 1
(21) Connection 1 of Level 2
(22) Connection 2 of Level 2
(23) Connection 3 of level 2
(24) Connection 4 of Level 2
(31) Connection 1 of Level 3
(32) Connection 2 of Level 3
(41) Tracking engines of the thermoelectric solar concentrators
(42) Photovoltaic collecting area integrated in the thermo-electric solar concentrators
(43) Auxiliary services of the solar thermal plant
(44) Thermoelectric solar or thermal solar plant
(45) Photovoltaic collecting area in the area of thermal solar process
(46) Area of photovoltaic production
(47) Electrical network
(48) Heliostats
(49) Tower
(51) Low voltage switch
(52) Medium voltage switch
(53) Transformer from low to medium voltage

(54) Transformer from medium to high voltage
(55) Medium voltage protection
(56) Solar thermal energy meter
(57) Area of photovoltaic energy meter
(58) Total plant energy meter
(60) Mirror
(61) Photovoltaic Module (PV)

PREFERRED EMBODIMENT OF THE INVENTION

In order to achieve a better understanding of the invention, the manageable hybrid plant of solar thermal and photovoltaic technology will be described below, according to a preferred embodiment.

The preferred embodiment describes the case of a tower plant as the technology used in the thermal solar plant.

Figure 2:
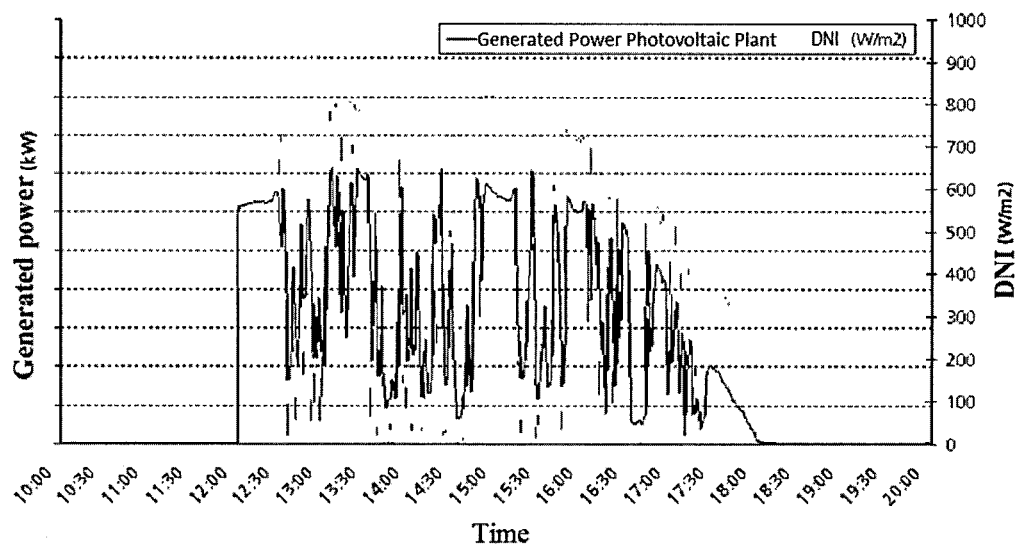
FIG. 2: Power generated by a photovoltaic plant versus DNI

FIGS. 1 and 2 show graphics that represent the power generated by a solar thermal plant and by a photovoltaic plant based on solar radiation received.

FIG. 1 shows that the solar thermal plant produces energy in terms of the radiation received but it is not too sensitive to transients or abrupt changes in radiation. However, in FIG. 2 is proved that the production of photovoltaic energy follows closely the pattern of solar radiation and is therefore quite unstable.

In view of the above graphs, it is understood the necessity of being able to combine both technologies, since the combination of both allows going to flatter production curves, desirable for the demand. Specifically for the period from 12:00 to 13:00 hours the photovoltaic production helps to flatten the curve of joint production, while in the case of 17:30 to 18:30 the solar thermal production is the one that contributes most to said flattening.

The additional fact that photovoltaic systems can take up the entire incident global radiation (both direct and diffuse radiation), will allow us to globally make better use of radiation in our plant, without losing the manageability and reliability offered by thermal solar production.

Figure 3:
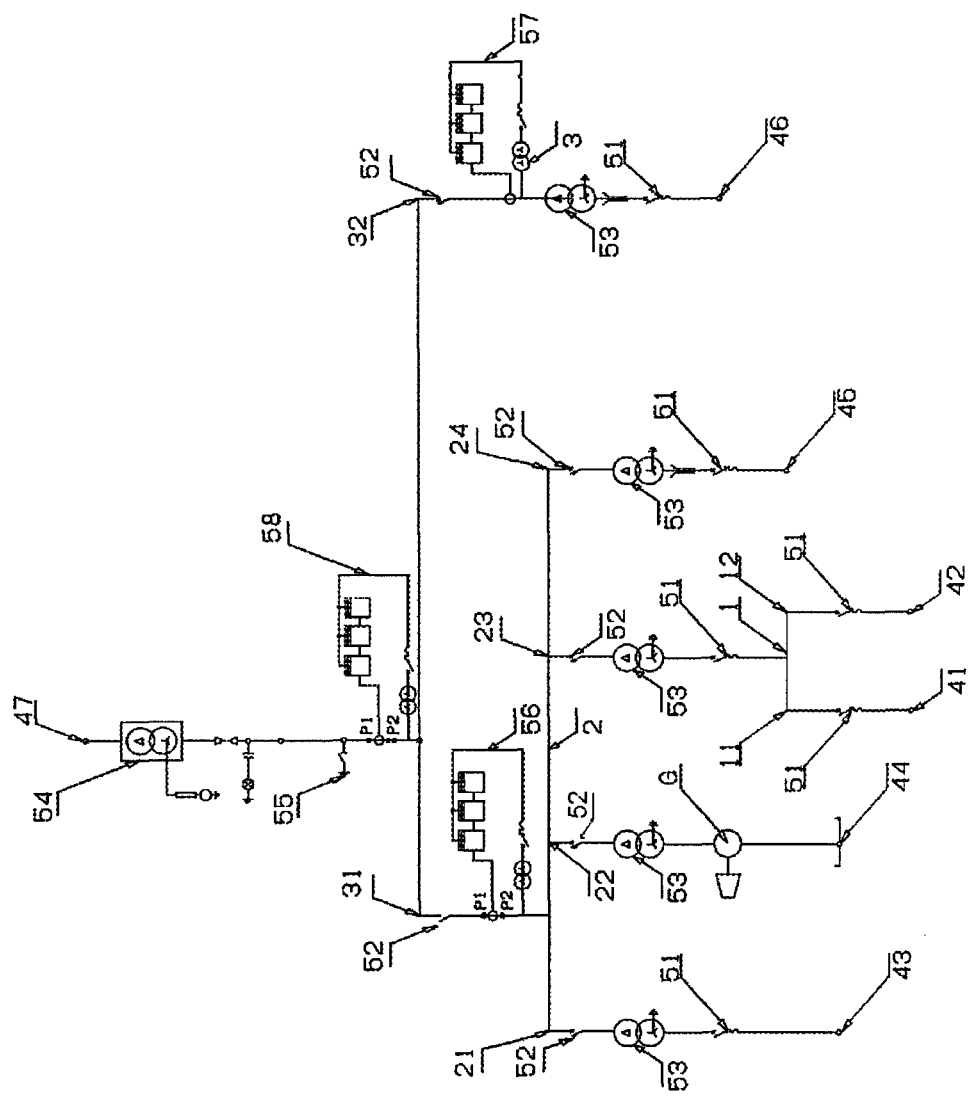
FIG. 3: Scheme of electrical connections

In the scheme of FIG. 3 the three levels of generation (1, 2, 3) set forth in the description are shown:

Level 1 (1) corresponds to the photovoltaic generation (42) and consumption in solar field of the tracking systems (41) of the concentration elements or heliostats of the thermoelectric solar plant and self consumption of the power block of the plant.

Level 2 (2) corresponds to the photovoltaic generation in solar thermal process (45) (panels located in the different sides of the tower, around the cavities or the generation of photovoltaic panels on covers of the various facilities of the plant), auxiliary services of the solar thermal plant (43) (pumps, control systems etc.) and thermal solar generation (44) (production through turbine of the thermoelectric solar plant).

Finally, the net output of this level 2 (2) joins at level 3 (3) with the generation of an area of photovoltaic production (46) to contribute to the improvement of the production curve and the result of their sum, being the power generated and discharged into the network (47).

The elements that comprise the different levels in this preferred embodiment are:

Level 1 (1): It comprises two low voltage connection lines (11, 12)
  A first connection (11) to the tracking engines of the thermoelectric solar concentrators (41) with a low voltage switch (51),
  A second connection (12) to the photovoltaic system integrated into said concentrators (42) with a low voltage switch (51).

Level 2 (2): It comprises four connection lines (21, 22, 23, and 24).

Each of the four lines (21, 22, 23, and 24) has a transformer from low to medium voltage (53) and medium voltage switch (52). For connection with level 1 (1) it has a transformer from low to medium voltage (53) to which it is connected or from which it is disconnected by means of a low voltage switch (51). For connection and disconnection from level 3 (3), it has a medium voltage switch (52).

Connection 1 (21): This is the connection line with the plant auxiliary systems (43) (pumps, control systems etc.).
  Connection 2 (22): connection line of the generator (G) or turbine corresponding to the solar thermal plant (44).
  Connection 3 (23): connection line of level 1 (1) with level 2 (2) through a switch (51).
  Connection 4 (24): connection line to the photovoltaic collecting area in the solar thermal process (45) area, i.e., the photovoltaic systems that are installed on different sides of the tower, or around the cavities or on covers, etc.

Level 3 (3): It comprises two lines of medium voltage connection (31, 32) and the network connection of the whole plant.

Connection 1 (31): it is the connection line with the solar thermal energy meter (56) of level 2 (2). Switches on and off via a medium voltage switch (52).
  Connection 2 (32): it is the connection line to the area of photovoltaic production (46) (these can be photovoltaic systems located in the same plot as the thermoelectric solar concentrators or heliostats, which could be located (see FIGS. 4 and 5) in the corners of a property with square boundaries (since the heliostat fields have traditionally a circular shape) or part of the land could be left at the back of the tower or in front of the tower for the photovoltaic panels or in another location or in a plot nearby). It also comprises a low voltage switch (51), medium voltage switch (52), a transformer from low to medium voltage (53) and an energy meter (57) of the photovoltaic production (46) area.

Level three (3) is connected to the network (47) with an optional energy meter for the whole plant (58) followed by a protection of medium voltage (55) and a final transformer (54) from medium to high voltage.

Figure 4:
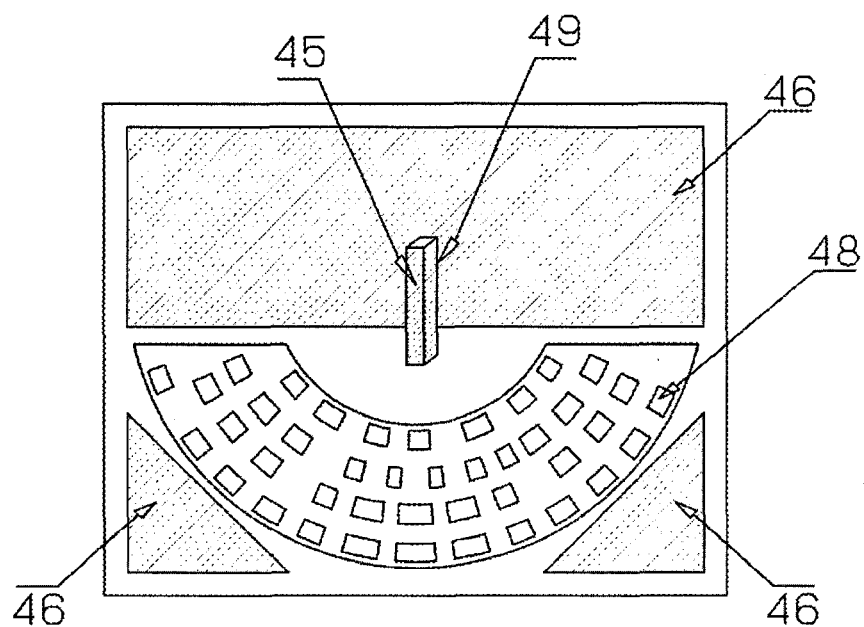
FIG. 4: First example of the location of the photovoltaic panels in the solar thermal plant
Figure 5:
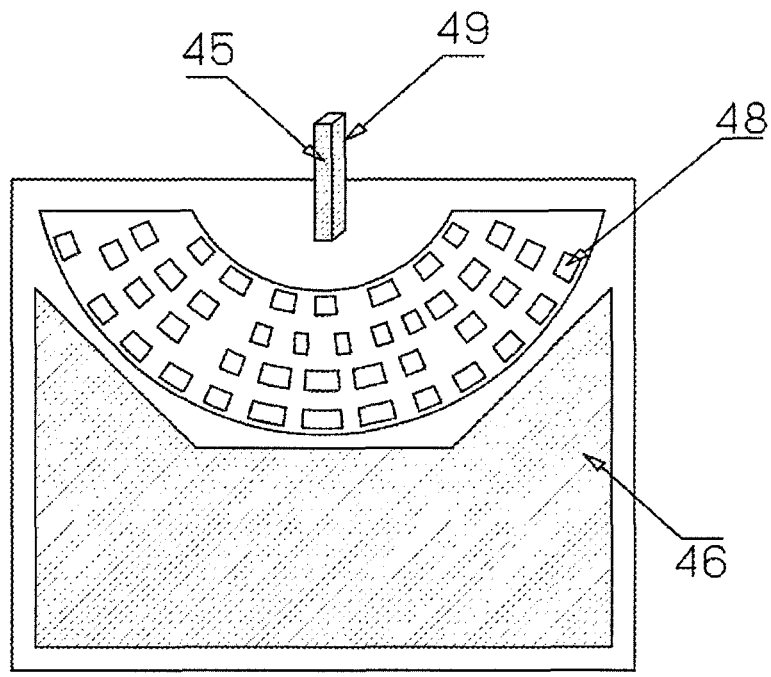
FIG. 5: Second example of the location of the photovoltaic in the solar thermal plant

FIGS. 4 and 5 show two examples of possible locations for the photovoltaic systems in the solar thermal plant.

FIG. 4 shows the tower (49) in the center of the rectangular plot with the heliostats (48) in semicircle configuration in front of it and uses the surface of the tower itself for the location of photovoltaic panels, these panels configuring what has been termed "photovoltaic collecting area in the solar thermal process area (45)". In addition, for the location of the photovoltaic modules with or without tracking and with or without concentration that make up the "area of photovoltaic production (46)", it makes use of the corners of the plot and the back of the tower (49).

FIG. 5 shows another example of configuration. In this case the tower (49) has been placed at the rear of the plot with photovoltaic panels on its surface (45), in front of it the heliostats semicircle (48) and all the extra space in front of the heliostats (48) has been used to place the photovoltaic systems of the area of photovoltaic production (46).

Figure 6:
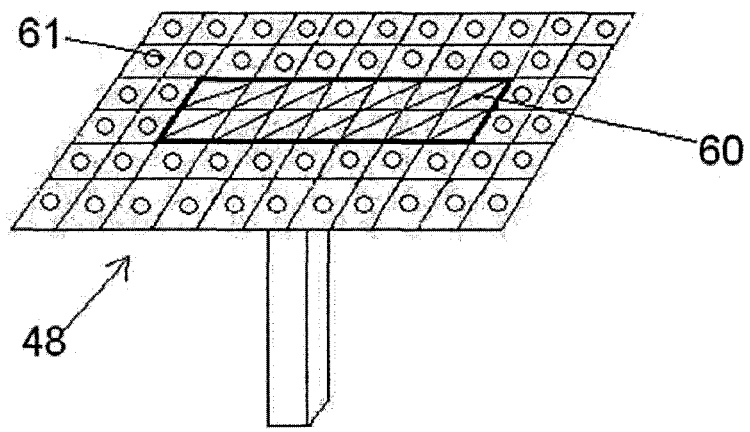
FIG. 6: First example of the location of the PV modules on the surface of the heliostats opening.
Figure 7:
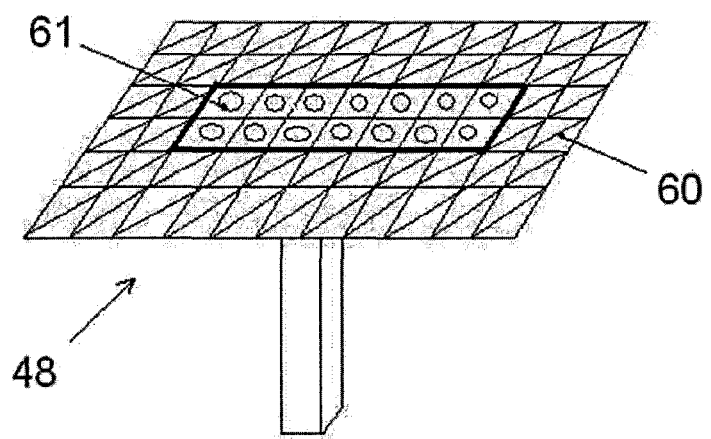
FIG. 7: Second example of the location of the PV modules on the surface of the heliostats opening.

FIGS. 6 and 7 illustrate two possible locations of the photovoltaic modules in the heliostats.

In FIG. 6 the mirrors occupy the central area of the net opening of the heliostat and the PV modules the periphery.

In FIG. 7 the mirrors occupy the periphery of the net opening of the heliostat and the central area is occupied by the PV modules. In addition to these configuration examples, other alternatives could be designed, but would not change the object of the invention or its essential characteristics.

The invention claimed is:

1. A manageable hybrid plant using photovoltaic and solar thermal technology, the solar thermal part of the plant being of the type that converts solar radiation into thermal energy by absorbing heat from the heat transfer fluid flowing through a receiver and that fluid, supersaturated and/or superheated and in the form of steam, is sent to a turbine to produce electricity and is hybridized with a natural gas boiler to meet the manageability requirements and is completed with a thermal storage system in the form of steam or molten salt in a series of tanks, to meet the established requirement of having a storage capacity of primary energy of at least 4 hours of use, and the part of photovoltaic plant being where solar radiation is captured in photovoltaic systems that generate electricity as DC which is transformed into alternating current by an inverter, wherein the hybrid plant includes three levels of generation:

Level 1 corresponds to a portion of the photovoltaic generation that covers the self consumption of solar tracking systems of the concentration elements or heliostats of the solar thermal plant and the self consumption of the power block of the plant;

Level 2 corresponds to the generation of the solar thermal plant and another portion of photovoltaic generation that covers the consumption of the auxiliary services of the solar thermal plant;

Level 3 corresponds to the generation of another area of photovoltaic production that contributes to improving the total production curve, the total power generated by the hybrid plant and discharged into the network, being the result of the sum of generation of the three levels and wherein level 1 comprises low voltage connection lines, level 2 comprises low voltage connection lines, which have transformers from low to medium voltage that connect level with level 2 and that allow for the subsequent connection to level 3, level 3 comprises medium voltage connection lines with or without high voltage transformers and with the network connection to the whole plant in medium or high voltage.

2. The manageable hybrid plant using photovoltaic and solar thermal technology according to claim 1, wherein the solar thermal technology is of the tower concentration thermoelectric type.

3. The manageable hybrid plant using photovoltaic and solar thermal technology according to claim 2 wherein the photovoltaic panels corresponding to the generation of level 1 are integrated into the thermoelectric solar concentrators being located in:
the back of the heliostats and/or
the clear opening of the heliostats, thus having the heliostats part of their opening occupied by mirrors and another part occupied by photovoltaic cells.

4. The manageable hybrid plant using photovoltaic and solar thermal technology according to claim 3 wherein the mirrors occupy the central area of the clear opening of the heliostat and the PV modules the periphery.

5. The manageable hybrid plant using photovoltaic and solar thermal technology according to claim 3 wherein the photovoltaic modules occupy the central area of the clear opening of the heliostat and the mirrors the periphery.

6. The manageable hybrid plant using photovoltaic and solar thermal technology according to claim 3 wherein the PV modules are placed alternately between the mirrors, occupying between both of them the total clear opening of the heliostat.

7. The manageable hybrid plant using photovoltaic and solar thermal technology according to claim 3 wherein the PV modules are placed randomly between the mirrors, occupying between both of them the total clear opening of the heliostat.

8. The manageable hybrid plant using photovoltaic and solar thermal technology according to claim 2 wherein in the case of a tower plant facing north (heliostats placed north of the tower and north-facing cavity), the photovoltaic panels corresponding to the generation of level 2 are located on the south side of the tower itself (panels facing the sun) and they would be installed with the opposite orientation in the case of tower solar plants facing south (southern latitudes).

9. The manageable hybrid plant using photovoltaic and solar thermal technology according to claim 8 wherein photovoltaic panels are installed on the east and west sides of the tower.

10. The manageable hybrid plant using photovoltaic and solar thermal technology according to claim 2 wherein the photovoltaic panels corresponding to the generation of level 2 are located in the area that surrounds the solar receivers of the tower.

11. The manageable hybrid plant using photovoltaic and solar thermal technology according to claim 10 wherein panels with high efficiency cells that can work with concentrated radiation are installed.

12. The manageable hybrid plant using photovoltaic and solar thermal technology according to claim 11 wherein the panels are accompanied by a water cooling system.

13. The manageable hybrid plant using photovoltaic and solar thermal technology according to claim 12 wherein water heated by this cooling system is introduced into a heat exchanger where the water going directly to the receiver of the solar thermal tower is preheated.

14. The manageable hybrid plant using photovoltaic and solar thermal technology according to claim 1 wherein photovoltaic systems with or without tracking and with or without concentration corresponding to the generation of level 3 are located annexed to the solar thermal plant.

15. The manageable hybrid plant using photovoltaic and solar thermal technology according to claim 2 wherein said photovoltaic systems are located in the corners of the property where the plant is installed.

16. The manageable hybrid plant using photovoltaic and solar thermal technology according to claim 2 wherein part of the land is left to the back of the tower for said photovoltaic systems.

17. The manageable hybrid plant using photovoltaic and solar thermal technology according to claim 2 wherein part of the land is left on the front of the tower for said photovoltaic systems.

18. The manageable hybrid plant using photovoltaic and solar thermal technology according to claim 2 wherein photovoltaic systems are installed between the heliostats, avoiding the shaded areas.

19. The manageable hybrid plant using photovoltaic and solar thermal technology according to claim 2 wherein photovoltaic systems are installed on a plot close to the plot of the solar thermal plant.

20. The manageable hybrid plant using photovoltaic and solar thermal technology according to claim 1 wherein the elements that comprise the different levels are:

Level 1: comprising two low voltage connection lines:
a first connection to the tracking engines of the thermoelectric solar concentrators with a low voltage switch, and
a second connection to the photovoltaic system integrated in said concentrators with a low voltage switch;

Level 2: comprising four connection lines, each of the four lines has a transformer from low to medium voltage and a medium voltage switch for connection and disconnection from the level 3:
connection 1: connection line with the auxiliary systems of the plant;
connection 2: connection line from the corresponding generator or turbine to the solar thermal plant;
connection 3: line connecting level 1 with level 2 through a switch;
connection 4: connection line to the photovoltaic systems that are installed on different sides of the tower or around the cavities or on covers;

Level 3: comprising two medium voltage connection lines and the network connection to the whole plant:
connection 1: connection line with the energy meter of the solar thermal production of Level 2, is connected and disconnected through a medium voltage switch;
connection 2: is the connection line to the area of photovoltaic production, it further comprises a low voltage switch, a transformer from low to medium voltage and an energy meter of the photovoltaic production area;
connection to the network with a medium voltage protection and a final transformer from medium to high voltage.

21. The manageable hybrid plant using photovoltaic and solar thermal technology according to claim 20 wherein an energy meter is installed for the whole plant before the connection to the network.

22. The manageable hybrid plant using photovoltaic and solar thermal technology according to claim 1, wherein the solar thermal technology is of the parabolic trough type.

23. The manageable hybrid plant using photovoltaic and solar thermal technology according to claim 1, wherein the solar thermal technology is of the parabolic collector type.

24. The manageable hybrid plant using photovoltaic and solar thermal technology according to claim 1, wherein the solar thermal technology is of the Fresnel type.

25. The manageable hybrid plant using photovoltaic and solar thermal technology according to claim 1, wherein the solar thermal technology is of the compact solar thermal plant type wherein the solar collectors concentrate the light directing it towards optical fibers or other light guides that lead it to a receiver located on the ground.

26. A method of operation of the plant described in claim 1, the method comprising the following steps:
when a sunny day starts, in the morning the DNI or solar irradiance is low; the solar thermal plant with the help of the natural gas auxiliary boiler begins to generate steam;
once the solar field exceeds the power of the auxiliary boiler it is decoupled from the system and the solar thermal plant, while generating electricity, begins to feed the storage system;
in the case of occurrence of transient states wherein the DNI or solar irradiance decreases or even disappears temporarily, the thermal inertia of the system itself, combined with the possibility of energy recovery from the storage system and the possibility of reusing the gas auxiliary boiler, achieve producing an electric signal with strong continuity;
while there is solar radiation, the photovoltaic cells generate an electrical signal that will fluctuate without any inertia following the DNI fluctuations, due to that instability, a portion of the photovoltaic generation energy will be used directly to cover the self consumption of the plant and the rest of the electricity generated by the photovoltaic field and that is not used for self consumption of the plant will produce an electrical signal that will be combined with the electrical signal from the solar thermal plant and that is injected to the network;
thus, the photovoltaic field contributes to the production of kWe early in the morning when the solar thermal field is not yet able to start producing; when there are transients, the solar thermal field with its inertia, and together with the auxiliary boiler and with the storage system, depending on the duration of the transient cited, is the one that gives continuity to the electric production and the same would happen once the sun has set at nightfall.

27. The manageable hybrid plant using photovoltaic and solar thermal technology according to claim 14, wherein said photovoltaic systems are located in the corners of the property where the plant is installed.

28. The manageable hybrid plant using photovoltaic and solar thermal technology according to claim 14, wherein part of the land is left to the back of the tower for said photovoltaic systems.

29. The manageable hybrid plant using photovoltaic and solar thermal technology according to according to claim 14, wherein part of the land is left on the front of the tower for said photovoltaic systems.

30. The manageable hybrid plant using photovoltaic and solar thermal technology according to according to claim 14, wherein photovoltaic systems are installed between the heliostats, avoiding the shaded areas.

31. The manageable hybrid plant using photovoltaic and solar thermal technology according to according to claim 14, wherein photovoltaic systems are installed on a plot close to the plot of the solar thermal plant.

* * * * *